United States Patent
Gill et al.

(10) Patent No.: US 6,930,862 B2
(45) Date of Patent: Aug. 16, 2005

(54) SHIELDED EXTRAORDINARY MAGNETORESISTANCE HEAD

(75) Inventors: Hardayal Singh Gill, Palo Alto, CA (US); Savas Gider, Mountain View, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 250 days.

(21) Appl. No.: 10/041,786

(22) Filed: Jan. 7, 2002

(65) Prior Publication Data

US 2003/0128478 A1 Jul. 10, 2003

(51) Int. Cl.[7] .................................................. G11B 5/39
(52) U.S. Cl. ........................ 360/313; 360/319; 360/326
(58) Field of Search ............................... 360/313, 324, 360/326, 319; 428/692, 611; 324/252; 338/32 R

(56) References Cited

U.S. PATENT DOCUMENTS

| | | | | |
|---|---|---|---|---|
| 4,255,772 A | * | 3/1981 | Perez et al. | 360/318 |
| 4,277,808 A | * | 7/1981 | Nagaki | 360/315 |
| 4,698,711 A | * | 10/1987 | Vinal | 360/321 |
| 4,885,649 A | * | 12/1989 | Das | 360/321 |
| 5,081,554 A | * | 1/1992 | Das | 360/327.1 |
| 5,436,779 A | * | 7/1995 | Valstyn | 360/318 |
| 5,508,868 A | * | 4/1996 | Cheng et al. | 360/321 |
| 5,583,726 A | * | 12/1996 | Mizoshita et al. | 360/321 |
| 6,396,670 B1 | * | 5/2002 | Murdock | 360/319 |
| 6,731,474 B2 | * | 5/2004 | Terunuma et al. | 360/319 |
| 2002/0093761 A1 | * | 7/2002 | Payne et al. | 360/125 |

FOREIGN PATENT DOCUMENTS

| | | | | |
|---|---|---|---|---|
| JP | 61145720 A | * | 7/1986 | G11B/5/39 |
| JP | 06267034 A | * | 9/1994 | G11B/5/39 |
| JP | 07244822 A | * | 9/1995 | G11B/5/39 |
| JP | 10049835 A | * | 2/1998 | G11B/5/39 |
| JP | 10222819 A | * | 8/1998 | G11B/5/39 |
| JP | 10334418 A | * | 12/1998 | G11B/5/39 |
| JP | 11316916 A | * | 11/1999 | G11B/5/39 |
| JP | 2000339642 A | * | 12/2000 | G11B/5/39 |
| JP | 2001352113 A | * | 12/2001 | H01L/43/08 |

OTHER PUBLICATIONS

Solin et al., "Room Temperature Extraordinary Magnetoresistance of Nonmagnetic Narrow–Gap Semiconductor/Metal Composites: Application to Read–Head Sensors for Ultrahigh–Density Magnetic Recording," Jan. 2002, IEEE Transactions on Magnetics, vol. 38, No. 1, pp. 89–94.*

English translation of Hirano (JP 61–145720 A).*

* cited by examiner

Primary Examiner—William J. Klimowicz
(74) Attorney, Agent, or Firm—Zilka-Kotab, PC

(57) ABSTRACT

An extraordinary magnetoresistance (EMR) magnetic head is provided including a first shield and a second shield defining a gap adapted for being positioned over a magnetic recording disk. An EMR sensor is positioned between the first shield and the second shield. In order to ensure proper operation of the EMR sensor, a plane in which the EMR sensor is positioned is perpendicular to magnetic flux associated with the magnetic recording disk.

23 Claims, 4 Drawing Sheets

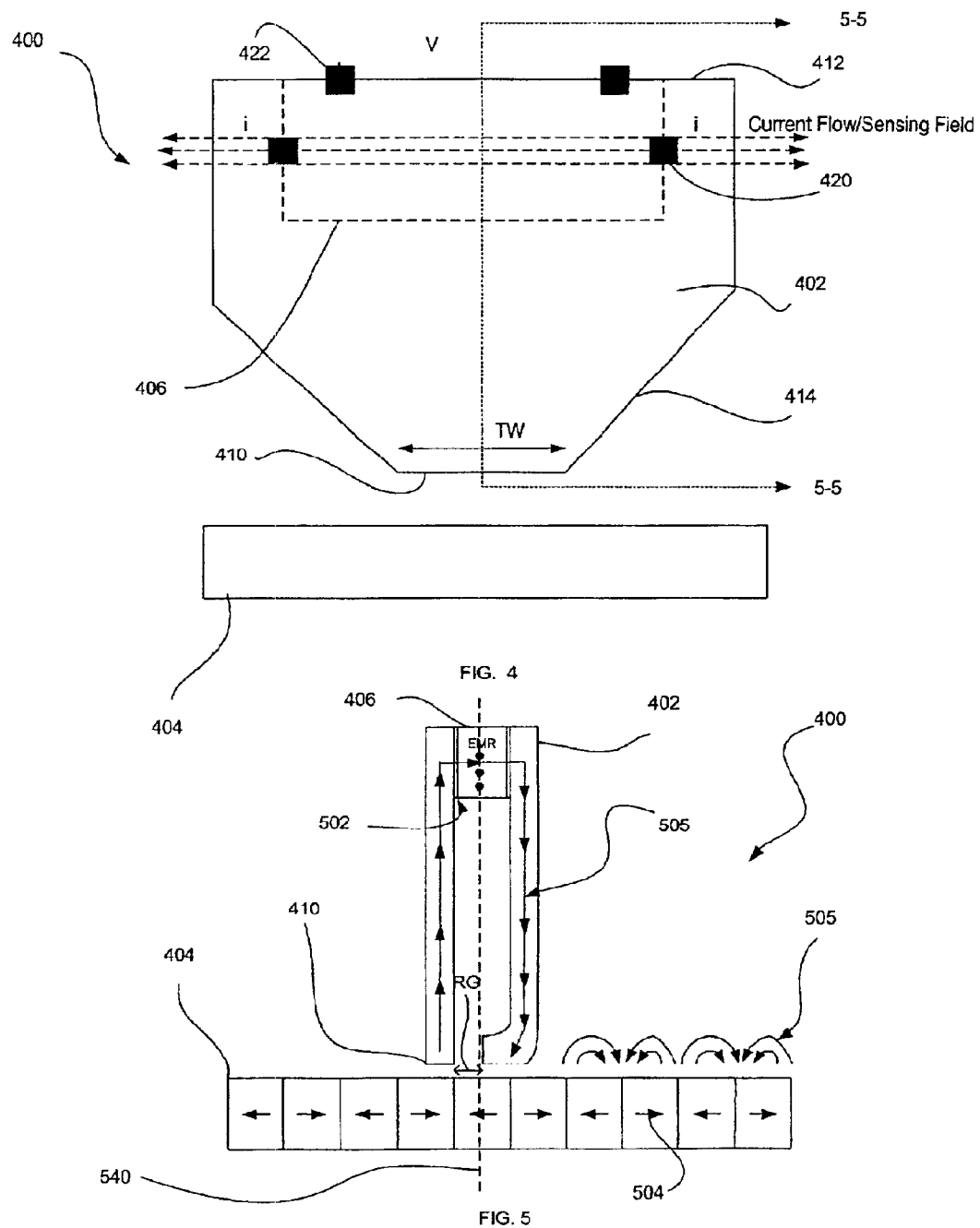

SHIELDED EXTRAORDINARY MAGNETORESISTANCE HEAD

FIELD OF THE INVENTION

The present invention relates to magnetoresistance heads, and more particularly, this invention relates to an extraordinary magnetoresistance head with improved operating characteristics.

BACKGROUND OF THE INVENTION

Computer systems generally utilize auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including magnetoresistance (MR) sensors are then used to read data from the tracks on the disk surfaces.

Prior Art FIG. 1 illustrates a magnetic head 100 adapted to accommodate traditional MR sensors. As shown, a pair of shields 102 is provided with an MR sensor 104 positioned therebetween. Further, such shields 102 have a rectangular configuration defined by parallel side edges. In use, the magnetic head 100 is adapted to be positioned over a magnetic recording disk 106 with an air bearing surface therebetween.

Prior Art FIG. 2 is a cross-sectional view taken along line 2—2 of FIG. 1 again showing the shields 102 with the MR sensor 104 therebetween. As shown in FIG. 2, the MR sensor 104 is maintained between the shields 102 at a lower extent thereof at a point immediately adjacent to the magnetic recording disk 106.

As is well known, the magnetic recording disk 106 is populated with magnetic flux that is representative of stored data. In use, a current is conventionally applied to the MR sensor 104, and a voltage is monitored across the MR sensor 104. Such voltage fluctuates as a function of a resistance of the MR sensor 104 which, in turn, fluctuates as a function of the particular magnetic fields that are present on the magnetic recording disk 106 as result of the flux. By this design, the MR sensor 104 may be used to read the contents of the magnetic recording disk 106 as the magnetic head 100 is moved.

Prior Art FIGS. 2-1 and 2-2 are cross-sectional views taken along lines 2-1 and 2—2 of FIG. 2 showing the current flow in the MR sensor 104 and the magnetic flux of the magnetic recording disk 106, respectively. As shown, the aforementioned current flow resides in a particular plane 200. Further, the magnetic flux 202 that is present on the magnetic recording disk 106 is parallel with such plane 200 of current flow. It should be noted that such parallel relationship between the magnetic flux 202 and the current flow plane 200 is required for traditional MR sensors to operate properly.

Recently, various institutions have recognized a new type of semiconductor material that exhibits extraordinary magnetoresistance (EMR). This is accomplished by embedding a Au metal within semiconductor material (e.g. InSb). More information on such EMR materials may be found with reference to the following article: Solin et al., "Enhanced Room-Temperature Magnetoresistance in Inhomogeneous Narrow-Gap Semiconductors," SCIENCE Journal, 1 Sep. 2000, Vol. 289, Page 1530. Further reference may be made to U.S. Pat. No. : 5,965,283 which is incorporated herein by reference.

While such EMR material has been recognized as a candidate for use in storage technology, there have currently been no advancements in actual implementations of such application. One suggested reason for such lack in the art is the different characteristics exhibited by EMR material with respect to traditional materials used with MR sensors 104. In particular, the MR sensors 104 can not simply be substituted with an EMR sensor.

As mentioned before, a field from recorded bits on a magnetic media flows in the plane of a sensor material in the case of giant MR or magnetic tunnel junction sensors. In sharp contrast, the field from the recorded bits needs to be perpendicular to the plane of the sensor material to obtain the extra-ordinary magnetoresistive effect when using EMR sensors.

One prior art solution is disclosed by Solin et al. in the "Digests of the Magnetic Recording Conference," 2001, paper C-5. Such solution provides a horizontal EMR sensor. However, this configuration is not suitable for current manufacturing methods, and is very difficult to construct.

There is thus a need for a practical application of EMR material in the storage technology domain.

DISCLOSURE OF THE INVENTION

An extraordinary magnetoresistance (EMR) magnetic head is provided including a first shield and a second shield defining a gap adapted for being positioned over a magnetic recording disk. An EMR sensor is positioned between the first shield and the second shield. In order to ensure proper operation of the EMR sensor, a plane in which the EMR sensor is positioned is perpendicular to magnetic flux associated with the magnetic recording disk.

In one embodiment, the EMR sensor may include a semiconductor material with impurities imbedded therein. For example, the impurities may include Au.

In another embodiment, the EMR head may further be equipped with a first insulator layer positioned between the first shield and the EMR sensor. Further, a second insulator layer may be positioned between the second shield and the EMR sensor.

In still another embodiment, a width of the shields at a first point on the shields proximate to the magnetic recording disk may be less than a second point on the shields distant the magnetic recording disk, where the EMR sensor is positioned. Such first point on the shield may define a trackwidth of the EMR head. At least a portion of the side edges of the shields may taper outwardly from the first point to the second point on the shields. Further, the first and second shields may be constructed from a ferromagnetic material.

In use, a current may be applied to a pair of current contacts positioned on the EMR sensor. It should be noted that the aforementioned plane is defined by a flow of the current. Moreover, the plane may also be defined by a sensing field associated with the EMR sensor. During operation, the magnetic fields associated with the magnetic recording disk reside in the shields to afford a voltage in the EMR sensor upon an application of the current via the current contacts. A pair of voltage contacts may thus be positioned on the EMR sensor for monitoring the voltage for the purpose of reading data from the magnetic recording disk.

DESCRIPTION OF THE DRAWINGS

For a fuller understanding of the nature and advantages of the present invention, as well as the preferred mode of use, reference should be made to the following detailed description read in conjunction with the accompanying drawings.

Prior Art

Prior Art

Prior Art FIGS. 2-1 and 2-2 are cross-sectional views taken along lines 2-1 and 2—2 of FIG. 2 showing the current flow in the MR sensor and the magnetic flux of the magnetic recording disk, respectively.

FIG. 4 illustrates an EMR read head constructed in accordance with one embodiment of the present invention.

FIG. 5 is a cross-sectional view taken along line 5—5 shown in FIG. 4 illustrating the magnetic flux associated with the magnetic recording disk.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 3:
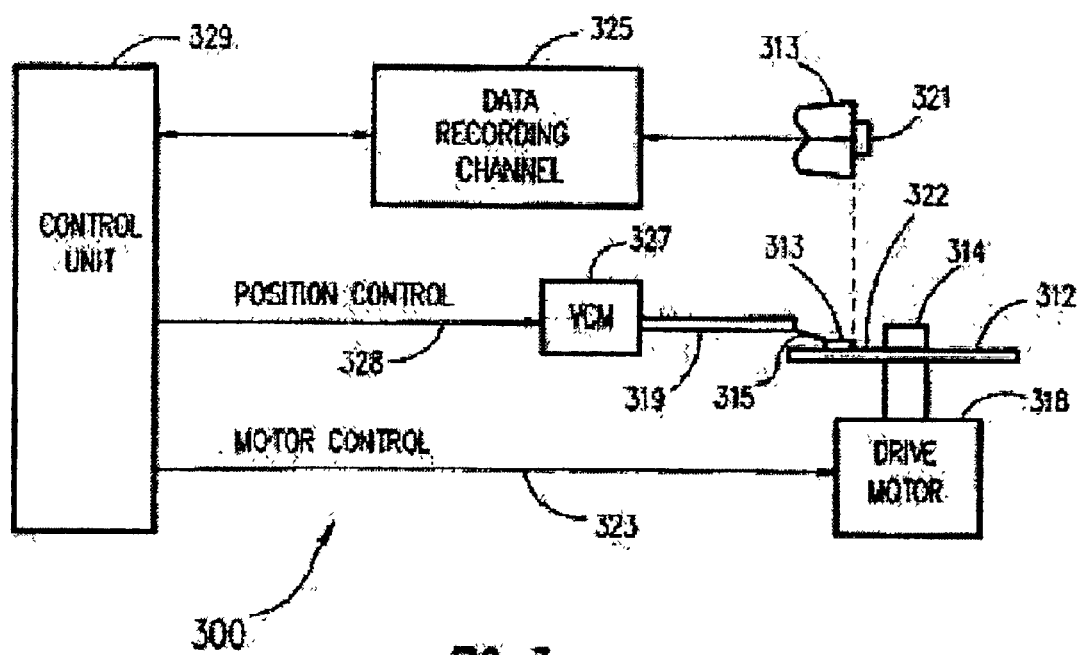
FIG. 3 is a perspective drawing of a magnetic recording disk drive system in accordance with one embodiment of the present invention.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321. More information regarding such heads 321 will be set forth hereinafter during reference to FIG. 4. As the disks rotate, slider 313 is moved radially in and out over disk surface 322 so that heads 321 may access different portions of the disk where desired data are recorded. Each slider 313 is attached to an actuator arm 319 by way of a suspension 315. The suspension 315 provides a slight spring force which biases slider 313 against the disk surface 322. Each actuator arm 319 is attached to an actuator 327. The actuator 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by way of recording channel 325.

The above description of a magnetic disk storage system, and the accompanying illustration of FIG. 3 are for representation purposes only. It should be apparent that disk storage systems may contain a large number of disks and actuators, and each actuator may support a number of sliders.

FIG. 4 illustrates an EMR read head 400 constructed in accordance with one embodiment of the present invention. In one embodiment, the EMR read head 400 may be used in the context of the magnetic disk storage system of FIG. 3. Of course, the EMR read head 400 may also be utilized in any other desired storage technology context. As shown in FIG. 4, a pair of shields 402 is provided for being positioned over a magnetic recording disk 404. Such shields 402 may be constructed from a ferromagnetic material.

An EMR sensor 406 is positioned between the shields 402 at an upper extent thereof. In particular, the EMR sensor 406 is positioned between the top edges of the shields 402.

The EMR sensor 406 may include a semiconductor material with impurities imbedded therein. In the context of the present description, the impurities may include Au or any other material that requires magnetic flux associated with the magnetic recording disk to propagate perpendicularly with respect to a plane of the EMR sensor 406. More information on EMR materials may be found with reference to U.S. Pat. No. 5,965,283 which is incorporated herein by reference. As will soon become apparent, a plane in which the EMR sensor 406 is positioned is perpendicular to magnetic flux associated with the magnetic recording disk 404 in order to ensure proper operation of the EMR sensor 406.

In one embodiment, the EMR sensor of the present invention may include a composite of non-magnetic InSb, a high mobility, narrow-gap semiconductor and metal, that exhibits room temperature MR orders of magnitude larger than that obtained to date with other materials. Although InSb exhibits moderate MR in the unpatterned state, embedded metallic inhomogeneities (i.e. Au) may be used to engender room temperature MR's as high as 100%, 9,000% and 750,000% at fields of 0.05, 0.25 and 4.0T, respectively. This extraordinary MR occurs because at H=0 the conducting inhomogeneity is a short circuit, as expected, but at a high field it acts, counter-intuitively, as an open circuit.

As an option, a width of the shields 402 at a first point 410 on the shields 402 proximate to the magnetic recording disk 404 may be less than a second point 412 on the shields 402 distant the magnetic recording disk 404. Moreover, such first point 410 on the shields 402 may define a trackwidth TW of the EMR head 400. As shown, at least a portion of the side edges 414 of the shields 402 may taper outwardly from the first point 410 to the second point 412 on the shields 402.

It should be noted that the specific configuration of the shields 402 may vary per the desires of the user. In particular, the configuration of the shields 402 may be varied in order to increase the read resolution of the EMR head 400. Moreover, any type of supporting structure may be utilized that ensures the plane in which the EMR sensor 406 resides is perpendicular to the magnetic flux associated with the magnetic recording disk 404.

Further provided on the EMR head 400 is a pair of current contacts 420 and a pair of voltage contacts 422. Optionally, the number and positioning of the current contacts 420 and the voltage contacts 422 may vary per the desires of the user.

In operation, a current may be applied to the current contacts 420 positioned on the EMR sensor 406. It should be noted that the aforementioned plane is defined by the flow of the current. Moreover, the plane is also defined by the sensing field associated with the EMR sensor 406. Note FIG. 4. Magnetic fields associated with the magnetic recording disk 404 propagate in the shields 402 as a result of the flux to afford a voltage in the EMR sensor 406 upon an application of the current via the current contacts 420. The voltage contacts 422 may thus be used for monitoring such voltage, and thus detecting the contents of the magnetic recording disk 404.

FIG. 5 is a cross-sectional view taken along line 5—5 shown in FIG. 4 illustrating the magnetic flux 504 associated with the magnetic recording disk 404. As shown, the shields 402 include a first and second shield which define a space therebetween. As shown in FIG. 5, the space between the shields 402 at the first point 410 defines a read gap RG of the EMR head 400.

Further provided is a pair of insulator layers 502. In particular, the EMR head 400 may be equipped with a first insulator layer positioned between the first shield and the EMR sensor 406. Further, a second insulator layer may be positioned between the second shield and the EMR sensor 406.

As mentioned earlier, a current is applied to the EMR sensor 406 via the current contacts 420. Further, a voltage is monitored at the voltage contacts 422 of the EMR sensor 406. Such voltage fluctuates as a function of a resistance of the EMR sensor 406 which, in turn, fluctuates as a function of the magnetic flux 504 that is present on the magnetic recording disk 404. By this design, the EMR sensor 406 may be used to read the contents of the magnetic recording disk 404 as the EMR head 400 is moved.

Figure 1:
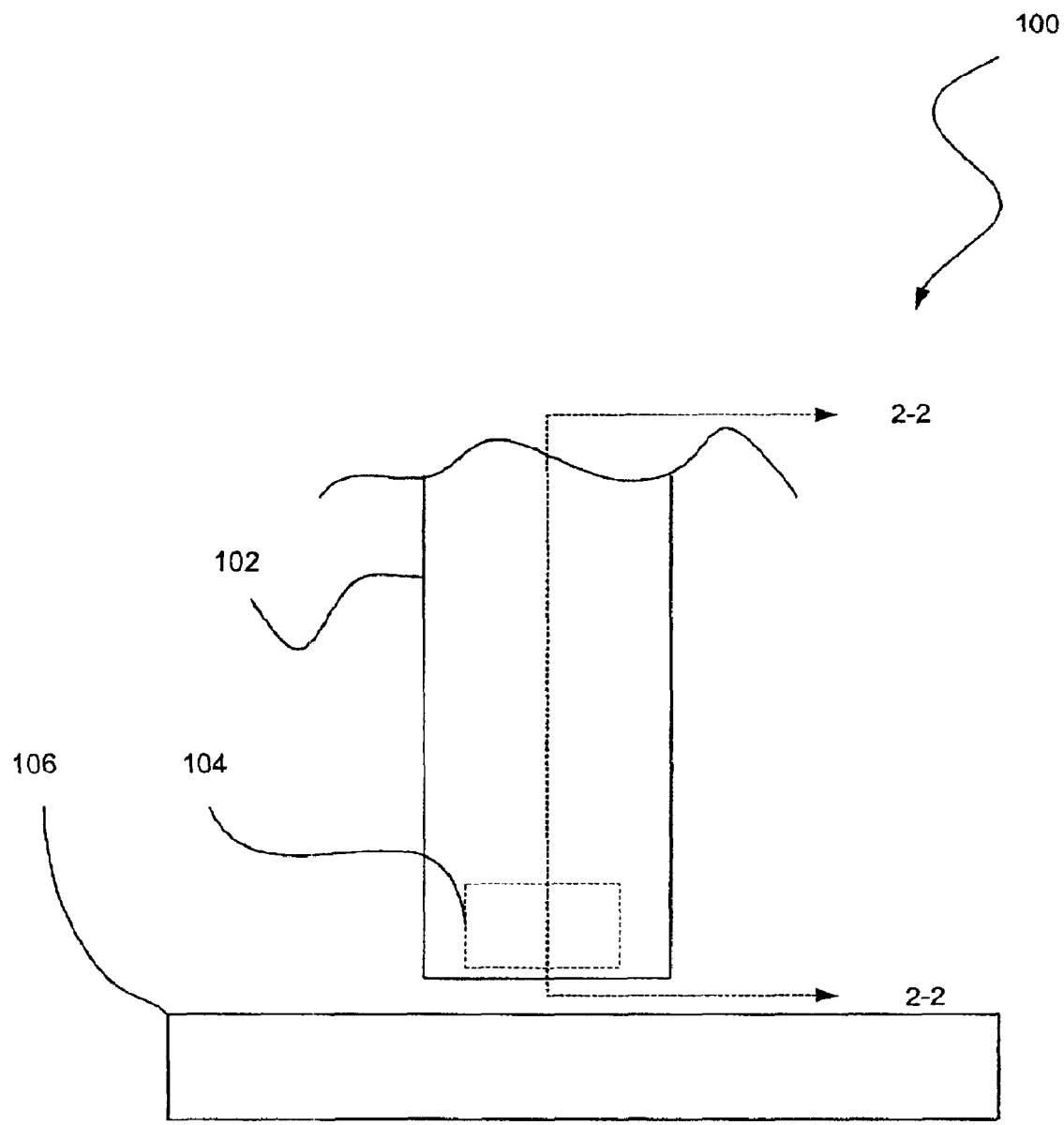
FIG. 1 illustrates a magnetic head adapted to accommodate traditional MR sensors.
Figure 2:
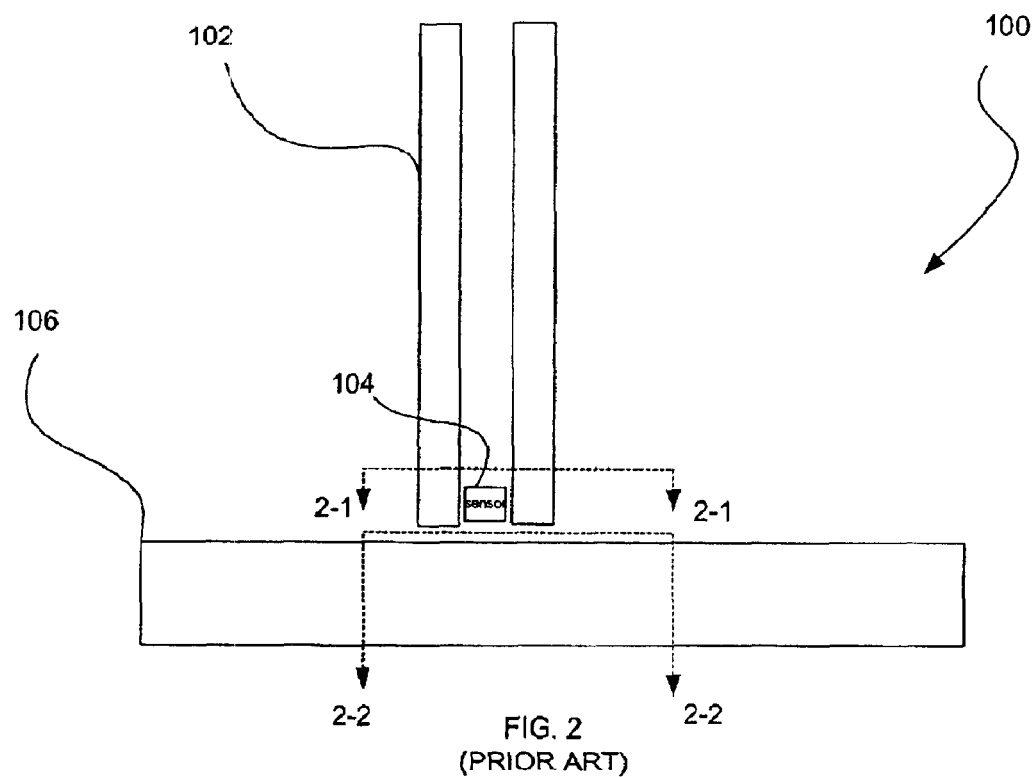
FIG. 2 is a cross-sectional view taken along line 2—2 of FIG. 1 showing shields with the MR sensor therebetween.
Figures 1, 2:
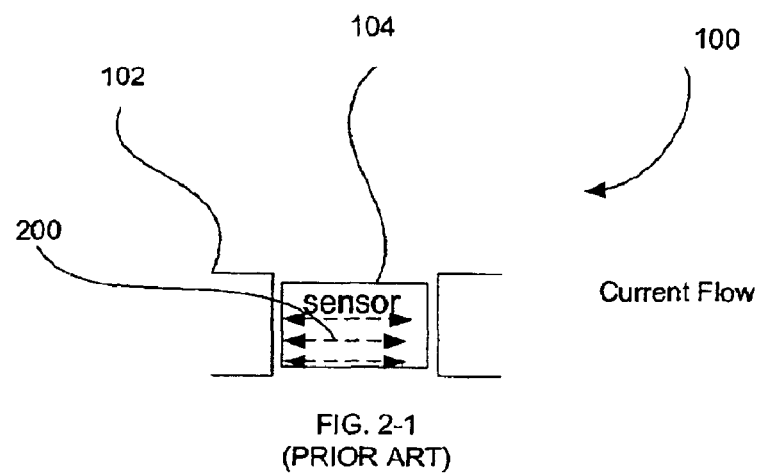
Figure 2:
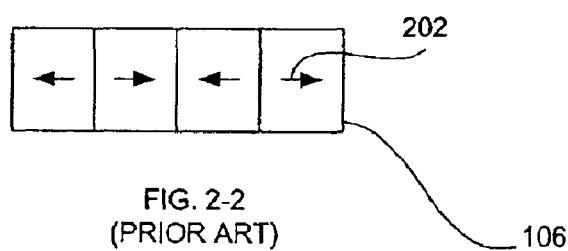

Unlike prior art devices like that shown in FIGS. 1 and 2, the present EMR sensor 406 is positioned at an upper extent of the shields 402. By this design, magnetic fields 505 propagate within the shields 402 as a result of the flux 504. More importantly, a plane 540 in which the EMR sensor 406 resides (as defined by the current flow/sensing field) is perpendicular to the magnetic flux 504 associated with the magnetic recording disk 404 in order to ensure proper operation of the EMR sensor 406.

As mentioned earlier, the EMR sensor 406 differs with respect to prior art MR sensors in this respect. By the unique positioning and resultant relative flux orientations of the present embodiment, the application of the EMR sensor 406 in a storage environment is effectively enabled.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An extraordinary magnetoresistance (EMR) magnetic head, comprising:
    a first shield and a second shield defining a gap adapted for being positioned over a magnetic recording disk, wherein the shields are not in physical contact with each other; and
    an EMR sensor positioned between the first shield and the second shield;
    wherein a plane in which the EMR sensor is positioned is perpendicular to magnetic flux associated with the magnetic recording disk;
    wherein a width of the shields at a first point on the shields proximate to the magnetic recording disk are less than widths thereof at a second point on the shields distant the magnetic recording disk, the widths being measured in a direction parallel to a track width of the magnetic head, wherein the width of the shields at the first point on the shields proximate to the magnetic recording disk define the track width of the magnetic head.

2. The magnetic head as recited in claim 1, wherein the EMR sensor includes a semiconductor material with impurities imbedded therein.

3. The magnetic head as recited in claim 2, wherein the impurities include doping.

4. The magnetic head as recited in claim 2, wherein the impurities include Au.

5. The magnetic head as recited in claim 1, and further comprising a first insulator layer positioned between the first shield and the EMR sensor, and a second insulator layer positioned between the second shield and the EMR sensor.

6. The magnetic head as recited in claim 1, wherein a current is applied to a pair of current contacts positioned on the EMR sensor.

7. The magnetic head as recited in claim 6, wherein the plane is defined by a flow of the current.

8. The magnetic head as recited in claim 6, wherein the plane is defined by a sensing field associated with the EMR sensor.

9. The magnetic head as recited in claim 6, wherein magnetic fields associated with the magnetic recording disk reside in the shields to afford a voltage in the EMR sensor upon an application of the current via the current contacts.

10. The magnetic head as recited in claim 9, wherein a pair of voltage contacts is positioned on the EMR sensor for monitoring the voltage.

11. The magnetic head as recited in claim 1, wherein the first point on the shield defines a trackwidth.

12. The magnetic head as recited in claim 1, wherein at least a portion of the side edges of the shields taper outwardly from the first point to the second point on the shields.

13. The magnetic head as recited in claim 1, wherein the EMR sensor is positioned at the second point on the shields, the second point of each shield being positioned at an upper extent of the associated shield.

14. The magnetic head as recited in claim 1, wherein the first and second shields are constructed from a ferromagnetic material.

15. The magnetic head as recited in claim 1, wherein the gap is offset from a center plane extending along a center line of the EMR sensor, the center line and center plane being parallel to the plane in which the EMR sensor is positioned.

16. The magnetic head as recited in claim 1, wherein the widths are measured perpendicular to a magnetic field circuit in the head.

17. The magnetic head as recited in claim 1, wherein the first shield angles towards the second shield at the first point, the second shield does not angle towards the first shield.

18. A system, comprising:
    a magnetic recording disk;
    an extraordinary magnetoresistance (EMR) sensor including a semiconductor material with Au imbedded therein;
    a pair of shields on opposite sides of the EMR sensor, wherein magnetic fields associated with the magnetic recording disk reside in the shields to alter a voltage in the EMR sensor upon an application of a current to the EMR sensor; and means for positioning a plane in which the EMR sensor is positioned perpendicular to magnetic flux associated with the magnetic recording disk;

wherein a width of the shields at a first point on the shields proximate to the magnetic recording disk are less than widths thereof at a second point on the shields distant the magnetic recording disk, the widths being measured in a direction parallel to a track width of the sensor, wherein the width of the shields at the first point on the shields proximate to the magnetic recording disk define the track width of the sensor.

19. A system, comprising:

a magnetic recording disk;

an extraordinary magnetoresistance (EMR) sensor including a semiconductor material with Au imbedded therein;

a pair of shields on opposite sides of the EMR sensor, wherein the first and second shields are not in physical contact with each other; and a supporting structure coupled to the EMR sensor for positioning the EMR sensor over the magnetic recording disk such that a plane in which the EMR sensor is positioned is perpendicular to magnetic flux associated with the magnetic recording disks;

wherein the first shield angles towards the second shield at a first point on the first shield proximate to the magnetic recording disk, the second shield does not angle towards the first shield at the first point.

20. A method of manufacturing an extraordinary magnetoresistance (EMR) magnetic head, comprising:

positioning a EMR sensor between a first and a second shield for being situated over a magnetic recording disk, the first and second shields not being in physical contact with each other;

wherein a plane in which the EMR sensor is positioned is perpendicular to magnetic flux associated with the magnetic recording disk;

wherein a width of the shields at a first point on the shields proximate to the magnetic recording disk are less than widths thereof at a second point on the shields distant the magnetic recording disk, the widths being measured in a direction parallel to a track width of the magnetic head, wherein the width of the shields at the first point on the shields proximate to the magnetic recording disk define the track width of the magnetic head.

21. A disk drive system, comprising:

a magnetic recording disk;

an extraordinary magnetoresistance (EMR) head including:

a first shield and a second shield defining a gap adapted for being positioned over the magnetic recording disk, the first and second shields not being in physical contact with each other, and an EMR sensor positioned between the first shield and the second shield, wherein a plane in which the EMR sensor is positioned is perpendicular to magnetic flux associated with the magnetic recording disk;

wherein a width of the shields at a first point on the shields proximate to the magnetic recording disk are less than widths thereof at a second point on the shields distant the magnetic recording disk, the widths being measured in a direction parallel to a track width of the head wherein the width of the shields at the first point on the shields proximate to the magnetic recording disk define the track width of the head;

an actuator for moving the EMR head across the magnetic recording disk so the EMR head may access different regions of magnetically recorded data on the magnetic recording disk; and a controller electrically coupled to the EMR head for detecting changes in resistance of the EMR read head.

22. An extraordinary magnetoresistance (EMR) magnetic head, comprising:

a first shield and a second shield constructed from a ferromagnetic material adapted for being positioned over a magnetic recording disk, the first and second shields not being in physical contact with each other;

an EMR sensor positioned between the first shield and the second shield, the EMR sensor including a semiconductor material with impurities imbedded therein;

a first insulator layer positioned between the first shield and the EMR sensor;

a second insulator layer positioned between the second shield and the EMR sensor; and a pair of current contacts positioned on the EMR sensor for applying a current through the EMR sensor, the flow of current through the EMR sensor defining a plane;

wherein the EMR sensor is positioned between the first shield and the second shield such that the plane is perpendicular to magnetic flux associated with the magnetic recording disk;

wherein a width of the shields at a first point on the shields proximate to the magnetic recording disk are less than widths thereof at a second point on the shields distant the magnetic recording disk, the widths being measured in a direction parallel to a track width of the magnetic head, wherein the width of the shields at the first point on the shields proximate to the magnetic recording disk define the track width of the magnetic head.

23. An extraordinary magnetoresistance (EMR) magnetic head, comprising:

a first shield and a second shield defining a gap adapted for being positioned over a magnetic recording disk; and an EMR sensor positioned between the first shield and the second shield;

wherein a plane in which the EMR sensor is positioned is perpendicular to magnetic flux associated with the magnetic recording disk, wherein magnetic fields associated with the magnetic recording disk reside in the shields such that the magnetic fields are applied to the sensor in a direction perpendicular to the plane in which the EMR sensor is positioned;

wherein a width of the shields at a first point on the shields proximate to the magnetic recording disk are less than widths thereof at a second point on the shields distant the magnetic recording disk, the widths being measured in a direction parallel to a track width of the magnetic head and perpendicular to a magnetic field circuit in the head;

wherein the first shield angles towards the second shield at the first point, the second shield does not angle towards the first shield.

* * * * *

UNITED STATES PATENT AND TRADEMARK OFFICE
CERTIFICATE OF CORRECTION

PATENT NO. : 6,930,862 B2
DATED : August 16, 2005
INVENTOR(S) : Gill et al.

It is certified that error appears in the above-identified patent and that said Letters Patent is hereby corrected as shown below:

Title page,
Item [56], References Cited, U.S. PATENT DOCUMENTS, add the following patent numbers:
-- 6,117,690
  5,965,283
  5,699,215
  5,422,621
  4,371,905
  4,935,832 --.
FOREIGN PATENT DOCUMENTS, add the following publication number:
-- WO 01/41214 A1     06/2001         WIPO ..... 23/58 --.
OTHER PUBLICATIONS, add the following citations:
-- Solin, S.A. et al; Enhanced Room-Temperature Geometric Magnetoresistance in Inhomogeneous Narrow-Gap Semiconductors, SCIENCE Vol. 289, 09/01/2000.

Solin, S.A. et al; Enhanced Room-Temperature Geometric Magnetoresistance in Inhomogeneous Narrow-Gap Semiconductors, The Magnetic Recording Conference, August 20-22, 2001.

Isai, Masaaki et al; Preparation and Crystal Properties of Thin InSb Films for Highly Sensitive Magnetoresistance Elements, Journal of Materials Research, 1986. --.

Chi, C. et al; Gradiometer Hall Probe, IBM Technical Disclosure Bulletin, Vol. 37 04/1994.

Gambino, R. et al; Improved Magnetoresistive Sensor, IBM Technical Disclosure Bulletin, Vol. 38, No. 08, August 1995.

Gambino, R. et al; Magnetic Films for Hall Effect Devices Useful for Magnetic Recording Heads, IBM Technical Disclosure Bulletin, Vol. 18, No. 12, May 1976. --.

UNITED STATES PATENT AND TRADEMARK OFFICE
CERTIFICATE OF CORRECTION

PATENT NO. : 6,930,862 B2
DATED : August 16, 2005
INVENTOR(S) : Gill et al.

It is certified that error appears in the above-identified patent and that said Letters Patent is hereby corrected as shown below:

<u>Column 8,</u>
Line 9, after "of the EMR" delete "read".

Signed and Sealed this

Thirteenth Day of December, 2005

JON W. DUDAS
*Director of the United States Patent and Trademark Office*